United States Patent
Tao et al.

(10) Patent No.: US 9,779,801 B2
(45) Date of Patent: Oct. 3, 2017

(54) METHOD AND CONTROL CIRCUIT FOR MEMORY MACRO

(71) Applicant: TAIWAN SEMICONDUCTOR MANUFACTURING COMPANY, LTD., Hsinchu (TW)

(72) Inventors: Derek C. Tao, Fremont, CA (US); Kuoyuan (Peter) Hsu, San Jose, CA (US); Annie-Li-Keow Lum, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 14/598,272

(22) Filed: Jan. 16, 2015

(65) Prior Publication Data

US 2016/0211012 A1    Jul. 21, 2016

(51) Int. Cl.
*G11C 8/16* (2006.01)
*G11C 11/419* (2006.01)
*G11C 7/22* (2006.01)

(52) U.S. Cl.
CPC ............ *G11C 11/419* (2013.01); *G11C 7/227* (2013.01); *G11C 8/16* (2013.01)

(58) Field of Classification Search
CPC ................................................. G11C 11/419
See application file for complete search history.

(56) References Cited

U.S. PATENT DOCUMENTS

| | | | |
|---|---|---|---|
| 6,091,627 A * | 7/2000 | Luo | G11C 8/16 365/154 |
| 8,605,523 B2 | 12/2013 | Tao et al. | |
| 8,630,132 B2 | 1/2014 | Cheng et al. | |
| 8,760,948 B2 | 6/2014 | Tao et al. | |
| 2013/0322193 A1* | 12/2013 | Sahu | G11C 7/227 365/194 |
| 2014/0032871 A1 | 1/2014 | Hsu et al. | |
| 2014/0153321 A1 | 6/2014 | Liaw | |
| 2014/0153345 A1 | 6/2014 | Kim et al. | |
| 2014/0177352 A1 | 6/2014 | Lum | |
| 2014/0233330 A1 | 8/2014 | Ko et al. | |
| 2014/0241077 A1 | 8/2014 | Katoch et al. | |
| 2014/0269114 A1 | 9/2014 | Yang et al. | |

* cited by examiner

*Primary Examiner* — Douglas King
(74) *Attorney, Agent, or Firm* — Hauptman Ham, LLP

(57) ABSTRACT

A method includes using a first tracking circuit corresponding to a first set of access ports of a memory macro to cause a signal transition of a first tracking signal based on an edge of a clock signal. Using a second tracking circuit corresponding to a second set of access ports of the memory macro, a signal transition of a second tracking signal is caused based on the edge of the clock signal. A reset signal is generated based on the signal transition of the first tracking signal and the signal transition of the second tracking signal. A read operation or a write operation on the memory macro is performed based on the edge of the clock signal and the reset signal.

17 Claims, 7 Drawing Sheets

METHOD AND CONTROL CIRCUIT FOR MEMORY MACRO

BACKGROUND

A multiple-port memory cell, such as a two port memory cell or a dual-port memory cell, includes at least a first access port and a second access port both configured for individually accessing a data node of the memory cell. A memory macro of multiple-port memory cells includes a plurality of multiple-port memory cells and is capable of accessing two or more of its memory cells during a single clock cycle using different word line signals associated with different access ports. In some applications, various word lines carry the word line signals, and the word lines extend in parallel over the memory cells. A signal transition on any one of the word lines would interfere with a word line signal on another one of the word lines through capacitive coupling.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
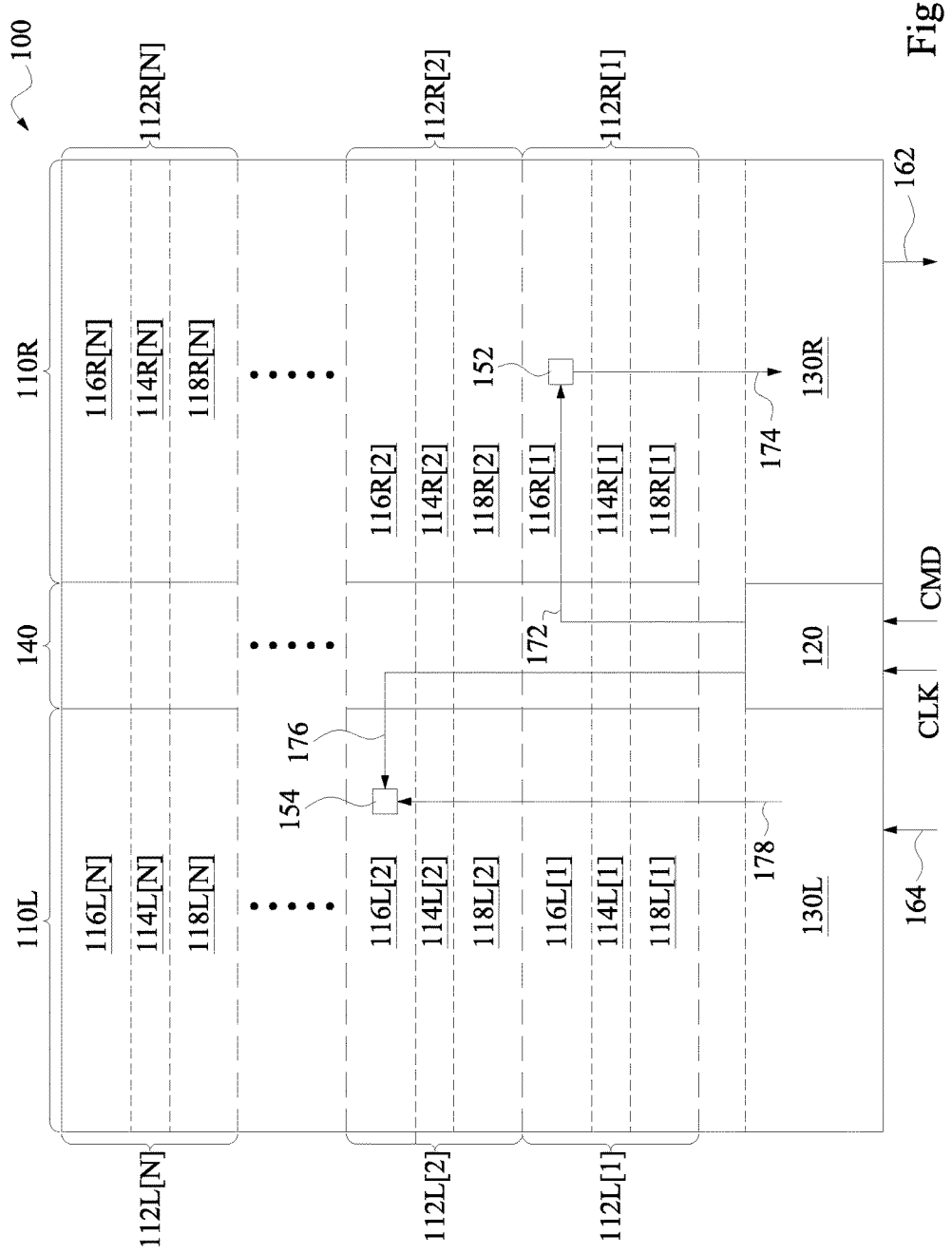
FIG. 1 is a block diagram of a memory macro in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a control circuit of a memory macro initiates at least two tracking circuits to cause signal transitions of at least two corresponding tracking reset signals. The control signal also generates first signal transitions of one or more word line signals based on a clock signal and second signal transitions of the one or more word line signals based on the time of occurrence of signal transitions of the at least two corresponding tracking reset signals. As such, in some embodiments, the second signal transitions of the one or more word lines occur concurrently, and the mutual-interferences among word line signals caused by the capacitive coupling of their second signal transitions thus does not have impact to the timing control of various access ports.

FIG. 1 is a block diagram of a memory macro 100 in accordance with some embodiments. Memory macro 100 is a static random access memory (SRAM) macro, and is used for illustration. Memory cells of memory macro 100 are multiple-port memory cells. Other types of memory macros are within the scope of various embodiments.

Memory macro 100 includes a first memory array 110L, a second memory array 110R, a global control circuit 120, a first global input/output (GIO) circuit 130L, a second GIO circuit 130R, a decoder array 140, and two or more tracking circuits (not shown) partially embedded in memory arrays 110L and 110R, GIO circuits 130L and 130R, and/or decoder array 140. Memory array 110L and memory array 110R are on opposite sides of decoder array 140. In some embodiments, memory array 110L is controlled by various drivers, bit lines, and word lines of decoder array 140 and GIO circuit 130L. In some embodiments, memory array 110R is controlled by various drivers, bit lines, and word lines of decoder array 140 and GIO circuit 130R. Moreover, decoder array 140, GIO circuit 130L, and GIO circuit 130R are controlled by global control circuit 120.

Memory array 110L includes memory segments 112L[1], 112L[2], and 112L[N]. N is an integer ranging from 1 to 16. Each memory segment 112L[1], 112L[2], or 112L[N] is controlled by a corresponding local input/output (LIO) circuit 114L[1], 114L[2], or 114L[N]. Each LIO circuit 114L[1], 114L[2], or 114L[N] is disposed in the middle of a corresponding memory segment 112L[1], 112L[2], or 112L[N] and divided the corresponding memory segment into an upper memory bank 116L[1], 116L[2], or 116L[N] and a lower memory bank 118L[1], 118L[2], or 118L[N]. Each memory bank has a plurality of memory cells arranged in rows and columns.

Memory array 110R includes memory segments 112R[1], 112R[2], and 112R[N]. Each memory segment 112R[1], 112R[2], or 112R[N] is controlled by a corresponding LIO circuit 114R[1], 114R[2], or 114R[N]. Each LIO circuit 114R[1], 114R[2], or 114R[N] is disposed in the middle of the corresponding memory segment 112R[1], 112R[2], or 112R[N] and divided the corresponding memory segment into an upper memory bank 116R[1], 116R[2], or 116R[N] and a lower memory bank 118R[1], 118R[2], or 118R[N]. In some embodiments, memory array 110L and memory array 110R are configured to be substantially symmetric about the decoder array 140.

In some embodiments, a LIO circuit does not divide the corresponding memory segment into multiple memory banks and thus the corresponding memory segment is controlled as a single memory bank.

Global control circuit 120 is configured to receive a clock signal CLK and a command CMD. In some embodiments, command CMD includes instructions regarding performing a read operation or a write operation of the memory macro and information regarding the address and the access port of the memory cell to be used for performing the read operation or the write operation. Global control circuit 120 works with one or more tracking circuits to generate one or more word line signals for accessing corresponding memory cells as instructed by the command CMD.

A tracking circuit of memory macro 100 is usable to generate a timing control signal based on a statistic model of the memory cells of memory macro 100 and the access ports of memory cells with which the tracking circuit associated. In some embodiments, a tracking circuit of memory macro 100 generates a timing control signal that is indicative of a weak memory cell at the access port of the weak memory cell with which the tracking circuit associated. In some embodiments, a weak memory cell is a statistical model that represents a memory cell having an access speed at a predetermined access port that is slower than an average access speed of the memory macro by about three to six standard deviations.

For example, as depicted in FIG. 1, based on the command CMD, global control circuit 120, working with decoder array 140, local control circuit 114R[1], GIO circuit 130R, and the tracking circuits, manages to read a memory cell 152 at bank 116R[1] to output a read datum 162. Also, based on the command CMD, global control circuit 120, working with decoder array 140, local control circuit 114L[2], GIO circuit 130L, and the tracking circuits, manages to write a memory cell 154 at bank 116L[2] to record a write datum 164. Global control circuit 120 and the tracking circuits cause the generation of a first word line signal 172 and the activation of a first bit line signal 174 to locate memory cell 152 and facilitate the read operation of memory cell 152. Global control circuit 120 and the tracking circuits also cause the generation of a second word line signal 176 and the activation of a second bit line signal 178 to locate memory cell 154 and facilitate the write operation of memory cell 154.

Figure 2A:
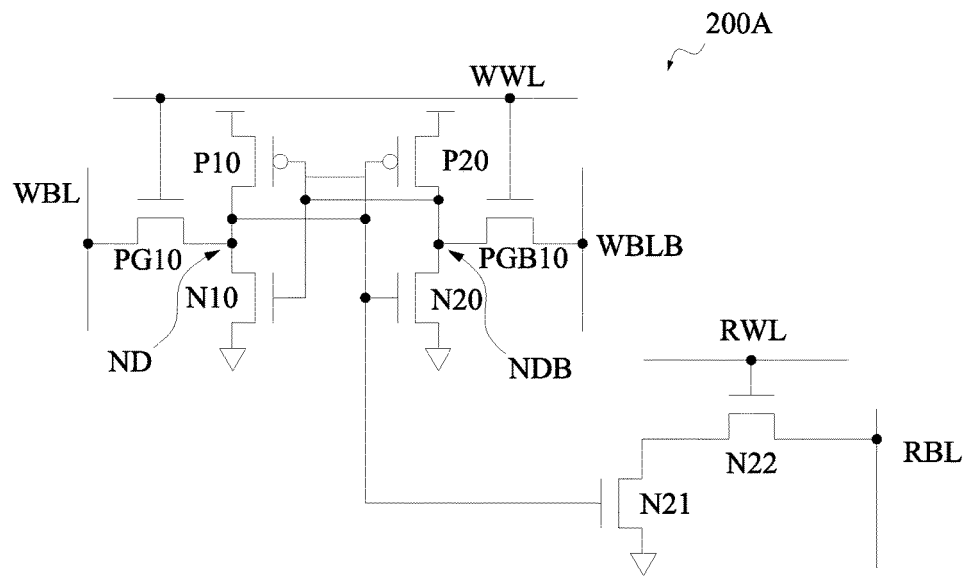
FIG. 2A is a circuit diagram of a memory cell usable in the memory macro in FIG. 1 in accordance with some embodiments.

FIG. 2A is a circuit diagram of a memory cell 200A usable in the memory macro 100 in FIG. 1 in accordance with some embodiments. Memory cell 200A is sometimes also referred to as a two port memory cell.

Memory cell 200A includes two P-type metal oxide semiconductor (PMOS) transistors P10 and P20, and two N-type metal oxide semiconductor (NMOS) transistors N10 and N20. Transistors P10, P20, N10, and N20 form a cross latch or cross-coupled inverters. Transistors P10 and N10 form a first inverter while transistors P20 and N20 form a second inverter. Drains of transistors P10 and N10 are coupled together and form a node ND. Drains of transistors P20 and N20 are coupled together and form a node NDB. Gates of transistors P10 and N10 are coupled together and to drains of transistors P20 and N20. Gates of transistors P20 and N20 are coupled together and to drains of transistors P10 and N10.

Moreover, memory cell 200A includes two access ports configured as a write port and a read port. The write port includes two NMOS transistors PG10 and PGB10, write word line WWL, and write bit lines WBL, WBLB. The read port includes two NMOS transistors N21 and N22, read word line RWL, and read bit line RBL. In some embodiments, read bit line RBL is a local read bit line, which is further coupled with LIO circuits (such as LIO circuits 114 in FIG. 1).

Write word line WWL is coupled with gates of transistors PG10 and PGB10. Write word line WWL is also coupled with also all the memory cells of the same row at the gates of transistors corresponding to transistors PG10 and PGB10 and with a decoder circuit (such as decoder circuit 140 in FIG. 1). Write word line WWL is also called a write control line because the signal on write word line WWL controls transistors PG10 and PGB10 for data on write bit lines WBL and WBLB to be written to corresponding nodes ND and NDB.

Each of transistor PG10 and transistor PGB10 is called a pass gate transistor. Drains of transistors PG10 and PGB10 are coupled to the pair of write bit lines WBL and WBLB, respectively. Write bit lines WBL and WBLB are coupled to each drain of transistors PG10 and PGB10 of a plurality of memory cells 200A in a column of a memory array. Write bit lines WBL and WBLB are also coupled with a write driver of GIO circuit, (such as GIO circuit 130 in FIG. 1). Each of write bit lines WBL and WBLB is also called a write data line because the data carried on write bit lines WBL and WBLB is written to corresponding nodes ND and NDB.

With respect to the read port, a gate of transistor N21 receives data from node ND. A source of transistor N21 receives a reference supply voltage, which, in some embodiments, is ground. A drain of transistor N21 is coupled with a source of transistor N22. A gate of transistor N22 is coupled with read word line RWL. A drain of transistor N22 is coupled with read bit line RBL. In some embodiments, read word line RWL is coupled with a row of memory cells 200A in a memory bank at the gates of transistors therein that correspond to transistor N22. Further, read bit line RBL is coupled with a column of memory cells 200A in a memory bank at the drains of transistors therein that correspond to transistor N22.

Figure 2B:
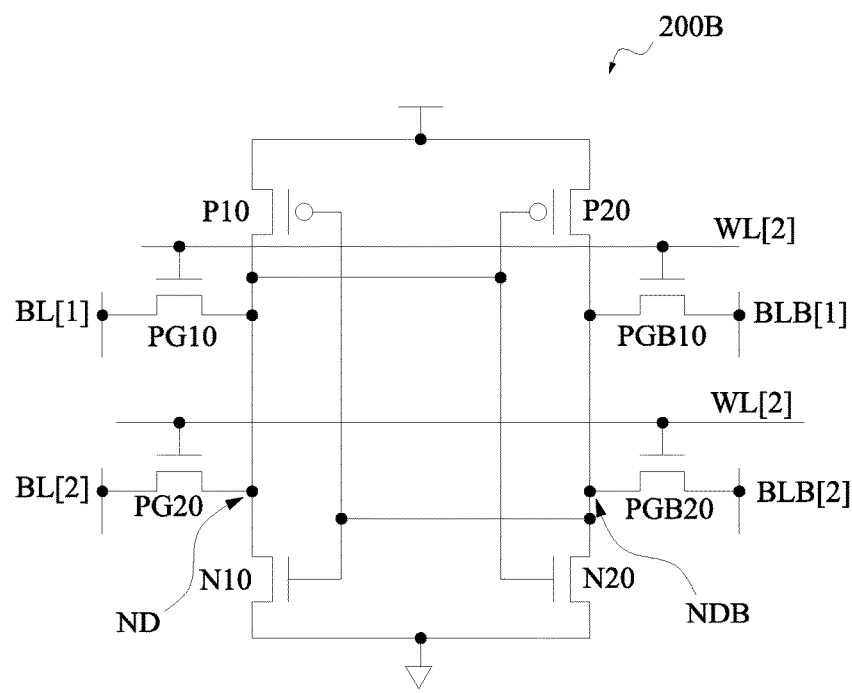
FIG. 2B a circuit diagram of another memory cell usable in the memory macro in FIG. 1 in accordance with some embodiments.

FIG. 2B a circuit diagram of another memory cell 200B usable in the memory macro 100 in FIG. 1 in accordance with some embodiments. Memory cell 200B is sometimes also referred to as a dual-port memory cell. Components of memory cell 200B that are the same or similar to those of memory cell 200A are given the same reference numbers, and detailed description thereof is thus omitted.

Memory cell 200B includes two access ports that each are usable as a write port or a read port. A first access port includes two NMOS transistors PG10 and PGB10, first word line WL[1], and write bit lines BL[1] and BLB[1]. A second access port includes two NMOS transistors PG20 and PGB20, second word line WL[2], and write bit lines BL[2] and BLB[2].

The first word line WL[1] is coupled with gates of transistors PG10 and PGB10. First word line WL[1] is also coupled with also all the memory cells of the same row at the gates of transistors corresponding to transistors PG10 and PGB10 and with a decoder circuit (such as decoder circuit 140 in FIG. 1). The signal on first word line WL[1] controls transistors PG10 and PGB10 for electrically coupling bit lines BL[1] and BLB[1] with nodes ND and NDB.

Each of transistor PG10 and transistor PGB10 is called a pass gate transistor. Drains of transistors PG10 and PGB10 are coupled to the pair of bit lines BL[1] and BLB[1], respectively. Bit lines BL[1] and BLB[1] are coupled to each drain of transistors PG10 and PGB10 of a plurality of memory cells 200B in a column of a memory array. Bit lines BL[1] and BLB[1] are also coupled with a write driver and/or a sense amplifier of GIO circuit, (such as GIO circuit 130 in FIG. 1).

The second access port has a configuration similar to that of the first access port. As depicted in FIG. 2B, the second word line WL[2] is coupled with gates of transistors PG20 and PGB20. second word line WL[2] is also coupled with also all the memory cells of the same row at the gates of transistors corresponding to transistors PG20 and PGB20 and with the decoder circuit. The signal on second word line WL[2] controls transistors PG20 and PGB20 for electrically coupling bit lines BL[2] and BLB[2] with nodes ND and NDB.

Each of transistor PG20 and transistor PGB20 is called a pass gate transistor. Drains of transistors PG20 and PGB20 are coupled to the pair of bit lines BL[2] and BLB[2], respectively. Bit lines BL[2] and BLB[2] are coupled to each drain of transistors PG20 and PGB20 of a plurality of memory cells 200B in a column of a memory array. Bit lines BL[2] and BLB[2] are also coupled with another write driver and/or a sense amplifier of GIO circuit, (such as GIO circuit 130 in FIG. 1).

Figure 3:
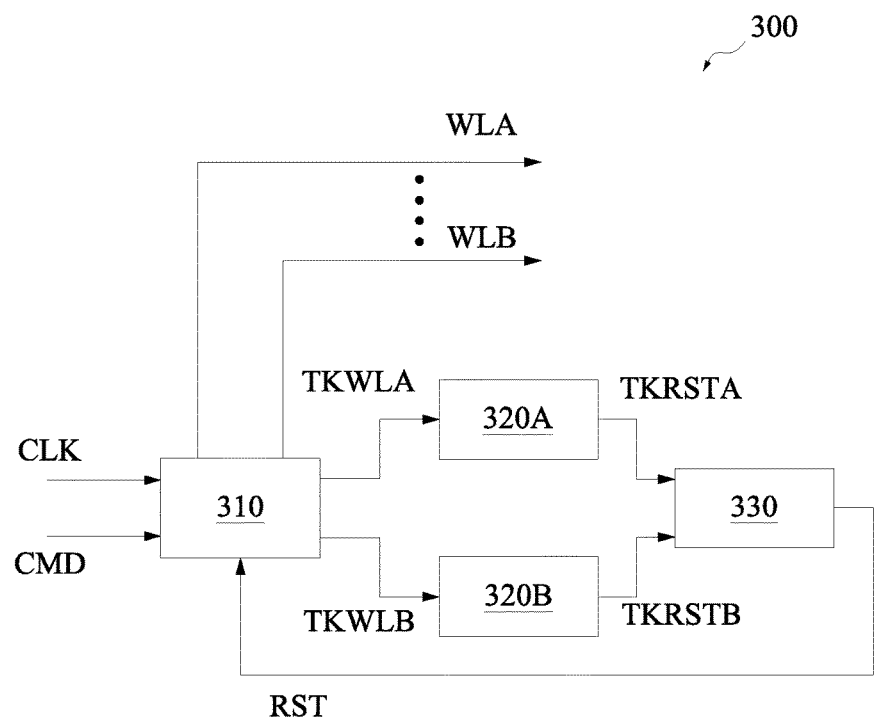
FIG. 3 is a functional block diagram of a control circuit usable in the memory macro in FIG. 1 in accordance with some embodiments.

FIG. 3 is a functional block diagram of a control circuit 300 usable in the memory macro in FIG. 1 in accordance with some embodiments.

Control circuit 300 includes a clock generator 310, tracking circuits 320A and 320B electrically coupled with clock generator 310, and a reset generator 330 electrically coupled with tracking circuits 320A and 320B and clock generator 310. In some embodiments, clock generator 310 is located within global control circuit 120 (FIG. 1). In some embodiments, tracking circuits 320A and 320B are partially within memory array 110L, memory array 110R, GIO circuit 130L, GIO circuit 130R, or decoder circuit 140 depicted in FIG. 1.

Clock generator 310 receives clock signal CLK, a command CMD, and a reset signal RST, and generates one or more of word line signals WLA and WLB. Each of the word line signals WLA and WLB corresponds to a different set of access ports of the memory macro. Word line signal WLA is usable to control the access of a memory cell through an access port corresponding to a first set of access ports of the memory macro. Also, word line signal WLB is usable to control the access of the memory cell or another memory cell through another set of access ports of the memory macro. In some embodiments, word line WLA corresponds to write word line WWL in FIG. 2A, and word line WLB corresponds to read word line RWL in FIG. 2A. In some embodiments, word line WLA corresponds to write word line WL[1] in FIG. 2B, and word line WLB corresponds to read word line WL[2] in FIG. 2B.

Clock generator 310 also generates tracking word line signals TKWLA and TKWLB based on an edge of clock signal CLK to initiate tracking circuits 320A and 320B. Tracking circuit 320A is configured to generate a tracking reset signal TKRSTA in response to tracking word line signal TKWLA, and tracking circuit 320B is configured to generate a tracking reset signal TKRSTB in response to tracking word line signal TKWLB. In some embodiments, tracking circuit 320A causes a signal transition of tracking reset signal TKRSTA by delaying a signal transition of tracking word line signal TKWLA. In some embodiments, tracking circuit 320B causes a signal transition of tracking reset signal TKRSTB by delaying a signal transition of tracking word line signal TKWLB. In some embodiments, clock generator 310 concurrently generates the transactions of tracking word line signals TKWLA and TKWLB based on reset signal RST.

Control circuit 300 depicted in FIG. 3 outputs two tracking word line signals TKWLA and TKWLB. In some embodiments, clock generator 310 generates three or more tracking word line signals based on the edge of clock signal CLK and reset signal RST, and each of the three or more tracking word line signals corresponding to accessing memory cells through a different set of access ports of the memory macro.

In some embodiments, tracking circuit 320A corresponds to a first set of access ports of the memory macro, such as the set of access ports corresponding to the write port of memory cell 200A in FIG. 2A or the first access port of memory cell 200B in FIG. 2B. In some embodiments, tracking circuit 320B corresponds to a second set of access ports of the memory macro, such as the set of access ports corresponding to the read port of memory cell 200A or the second access port of memory cell 200B.

Control circuit 300 depicted in FIG. 3 includes two tracking circuits 320A and 320B. In some embodiments, control circuit 300 includes three or more tracking circuits corresponding to three or more different sets of access ports of a memory macro. In some embodiments, although there are three or more different sets of access ports of a memory macro, the memory macro memory has only two tracking circuits 320A and 320B for modeling two estimated worst access ports, or an estimated worst read port and an estimated worst write port.

Reset generator 320 receives tracking reset signals TKRSTA and TKRSTB and generates reset signal RST based on tracking reset signals TKRSTA and TKRSTB. In some embodiments, control circuit 300 includes only two tracking circuits, such as tracking circuits 320A and 320B, and reset generator 320 generates the reset signal RST based on a later one of the transition of the tracking reset signal TKRSTA and the transition of the tracking reset signal TKRSTB. In some embodiments, control circuit 300 includes three or more tracking circuits, such as a third tracking circuit generating a third tracking reset signal in response to a third tracking word line signal, which is also generated based on the edge of the clock signal CLK. The third tracking circuit corresponds to a third set of access ports of the memory macro. Reset generator 320 thus generates the reset signal RST based on a latest one of the transitions of the tracking reset signals from the three or more tracking circuits. In some embodiments, control circuit 300 includes three or more tracking circuits, and reset generator 320 generates the reset signal RST based on a later one of the transitions of the tracking reset signals from two selected tracking circuits of the three or more tracking circuits.

Figure 4:
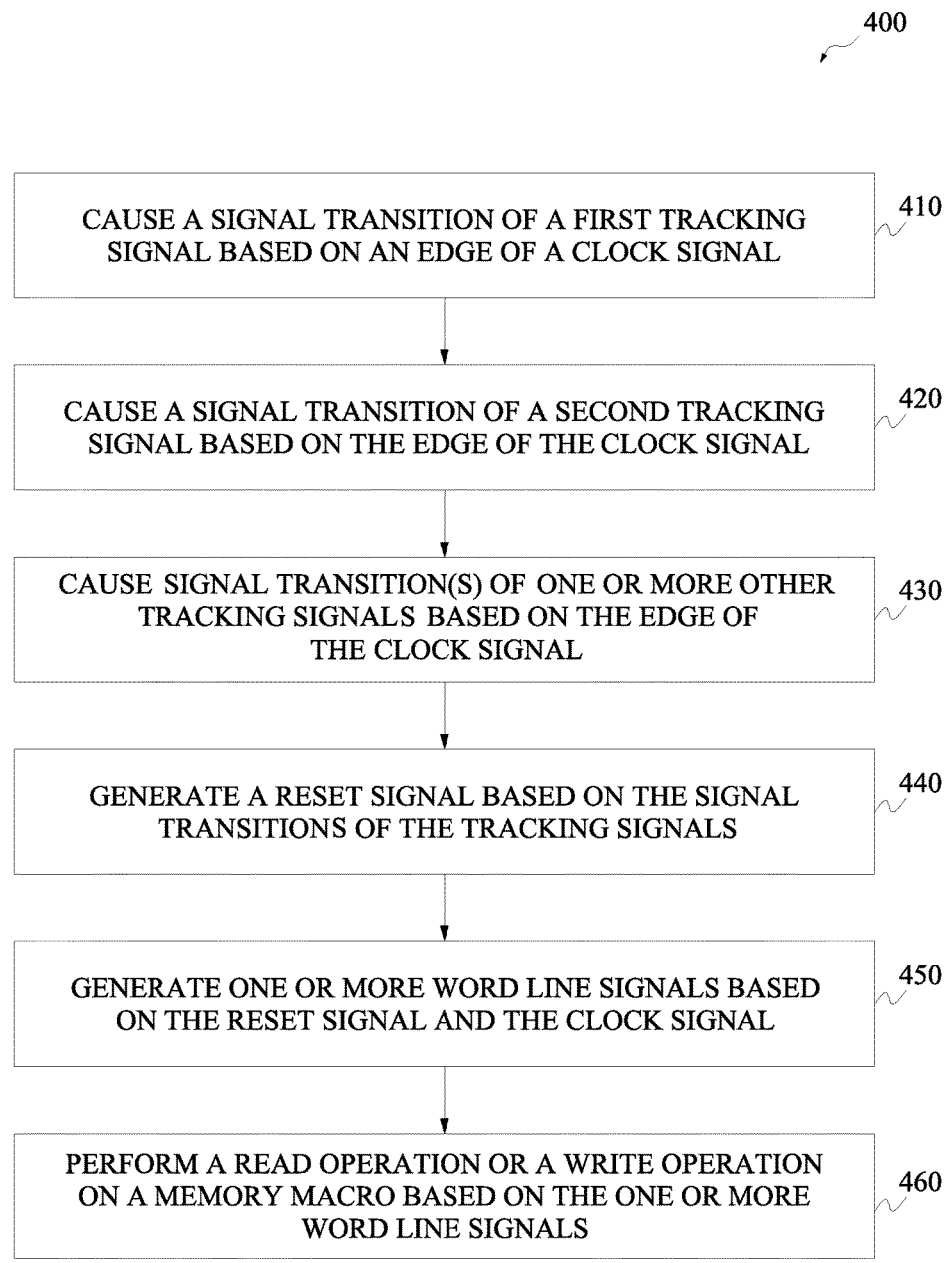
FIG. 4 is a flow chart of a method of operating the control circuit in FIG. 3 in accordance with some embodiments.
Figure 5:
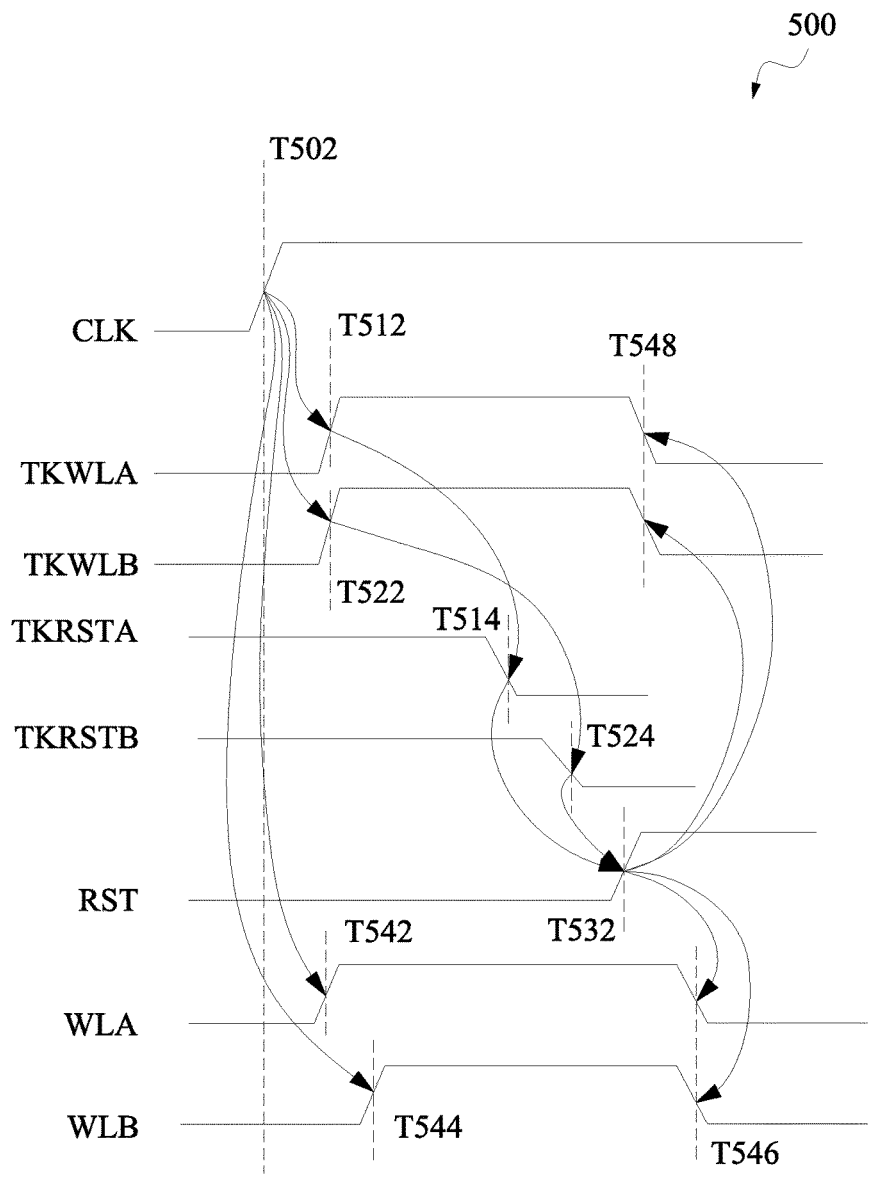
FIG. 5 is a graph 500 of waveforms at various nodes of the control circuit in FIG. 3 in accordance with some embodiments.

FIG. 4 is a flow chart of a method 400 of operating the control circuit in FIG. 3 in accordance with some embodiments. It is understood that additional operations may be performed before, during, and/or after the method 400 depicted in FIG. 4, and that some other processes may only be briefly described herein. FIG. 5 is a graph 500 of waveforms at various nodes of the control circuit in FIG. 3 for illustrating the method 400 depicted in FIG. 4 in accordance with some embodiments. Components in FIG. 5 that is the same or similar to those depicted in FIG. 3 are given the same reference numbers.

The method 400 begins with operation 410, where the clock generator 310 causes a signal transition of a first tracking signal based on an edge of a clock signal. For example, clock generator 310 causes tracking circuit 320A to generate a tracking reset signal TKRSTA based on an edge of clock signal.

As an example illustrated in FIG. 5, at time T502, clock signal CLK has an edge corresponding to a signal transition of clock signal CLK from a logically low level to a logically high level. At time 512, clock generator 310 generates a first signal transition of a tracking word line signal TKWLA responsive to the edge (at time T502) of clock signal CLK to trigger tracking circuit 320A. At time 514, tracking circuit 320A generates a signal transition of tracking reset signal TKESTA in response to the first signal transition of tracking word line signal TKWLA and a delay imposed by operating tracking circuit 320A.

The method 400 proceeds to operation 420, where the clock generator 310 causes a signal transition of a second tracking signal based on the edge of a clock signal. For example, clock generator 310 causes tracking circuit 320B to generate a tracking reset signal TKRSTB based on the edge of clock signal on which tracking circuit 320A also relied upon to generate tracking reset signal TKRSTA.

As an example illustrated in FIG. 5, at time 522, clock generator 310 generates a first signal transition of a tracking word line signal TKWLB responsive to the edge (at time T502) of clock signal CLK to trigger tracking circuit 320B. At time 524, tracking circuit 320B generates a signal transition of tracking reset signal TKRSTB in response to the first signal transition of tracking word line signal TKWLB and a delay imposed by operating tracking circuit 320B.

Tracking circuit 320A and tracking circuit 320B each correspond to different sets of access ports. However, even only one of the sets of access ports is about to be used to access a memory cell of the memory macro, clock generator 310 still generates both tracking word line signals TKWLA and TKWLB to cause the signal transitions of tracking reset signals TKRSTA and TKRSTB. In some embodiments, memory macro has three or more sets of access ports. In some embodiments, even only one set of access ports of the memory macro to whom neither tracking circuits 320A and 320B are associated, clock generator 310 still generates both tracking word line signals TKWLA and TKWLB to cause the signal transitions of tracking reset signals TKRSTA and TKRSTB.

The method 400 proceeds to operation 430, where the clock generator 310 causes one or more signal transitions of other one or more tracking signals based on the edge of the clock signal. For example, clock generator 310 causes one or more tracking circuits other than tracking circuits 320A and 320B to generate one or more other tracking reset signals based on the edge of clock signal. In some embodiments, operation 430 is optional depending on the presence of one or more tracking circuits other than tracking circuits 320A and 320B in the memory macro and/or whether the one or more tracking circuits are activated.

The method 400 proceeds to operation 440, where a reset generator generates a rest signal based on the signal transitions of the tracking signals. For example, reset generator 330 generates rest signal RST having a signal transition caused based on the signal transitions of the tracking reset signals TKRSTA and TKESTB. In some embodiments, if control circuit includes one or more other tracking circuits triggered by clock generator 310, reset generator 330 causes the transition of rest signal RST having a signal transition caused based on the signal transitions of the tracking reset signals TKRSTA and TKESTB and one or more other tracking reset signals. In some embodiments, the transition of rest signal RST is generated based on time of occurrence of signal transitions of various tracking reset signals.

As an example illustrated in FIG. 5, at time 532, reset generator 330 generates a signal transition of rest signal RST responsive to the later one of tracking reset signals TKRSTA and TKESTB. In some embodiments if three or more tracking reset signals are generated, reset generator 330 generates a signal transition of rest signal RST responsive to the latest one of the three or more tracking reset signals.

The method 400 proceeds to operation 450, where one or more word line signals are generated based on the reset signal and the clock signal. For example, clock generator 310 generates word line signals WLA and WLB based on clock signal CLK and reset signal RST. In some embodiments, clock generator 310 generates first signal transitions of word line signals WLA and WLB based on clock signal CLK. In some embodiments, clock generator 310 generates second signal transitions of word line signals WLA and WLB based on reset signal RST. In some embodiments, only one of word line signals WLA and WLB is generated based on the instructions come with the command CMD. In some embodiments, one or more other word line signals are generated. In some embodiments, the second signal transactions of word line signals WLA and WLB are caused to occur concurrently in response to reset signal RST.

As an example illustrated in FIG. 5, at time 542, clock generator 310 generates a first signal transition of word line signal WLA responsive to the edge (at time T502) of clock signal CLK. At time 544, clock generator 310 generates a first signal transition of word line signal WLB responsive to the edge (at time T502) of clock signal CLK. The timing of time 542 and 544 varies. In some embodiments, the timing of time 542 and 544 is set based on the preparation of other relevant components for accessing the sets of access ports corresponding to word lines WLA and WLB. In some embodiments, the preparation of other relevant components for accessing the sets of access ports includes pre-charging corresponding bit lines, pre-fetch data signals for write drivers, or adjusting power supply voltages for the memory cells of the memory macro.

Furthermore, at time 546, clock generator 310 generates a second signal transition of word line signal WLA and a second signal transition of word line signal WLB responsive to the transition (at time T532) of rest signal RST. In the embodiment depicted in FIG. 5, second signal transitions of word line signals WLA and WLB are concurrently generated.

Reset signal RST is also usable to reset other signals or other operations of memory macro. In the embodiment depicted in FIG. 5, tracking word lines TKWLA and TKWLB are reset to a logically low level at time T548 in response to the transition (at time T532) of rest signal RST. In some embodiments, reset signal RST is also usable to turn off one or more of multiplexers and/or address registers of the memory macro.

The method 400 proceeds to operation 460, where the memory macro performs one or more read operations or one or more write operations through different sets of access ports of the memory macro based on the one or more word line signals, such as word line signals WLA and/or WLB.

In some embodiments, operation 460 includes performing a read operation through one of a first set of access ports of memory macro 100, where the first set of access ports is a plurality of read ports corresponding to the read port of memory cell 200A. In some embodiments, operation 460 includes performing a write operation through one of a second set of access ports of memory macro 100, where the second set of access ports is a plurality of write ports corresponding to the write port of memory cell 200A.

In some embodiments, the memory macro 100 has memory cells each having the configuration of memory cell 200A in FIG. 2A. In some embodiments, operation 460 includes performing a read operation on a memory cell of memory macro 100 through a read port of the memory cell in response to a read word line signal. In some embodiments, operation 460 includes performing a write operation on another memory cell through a write port of the another memory cell in response to a write word line signal. In some embodiments, the memory cell and the another memory cell are at the same row in a memory bank. As such, the memory cell and the another memory cell are configured to receive the read word line signal at their corresponding read ports and to receive the second word line signal at their corresponding write ports.

Figure 6:
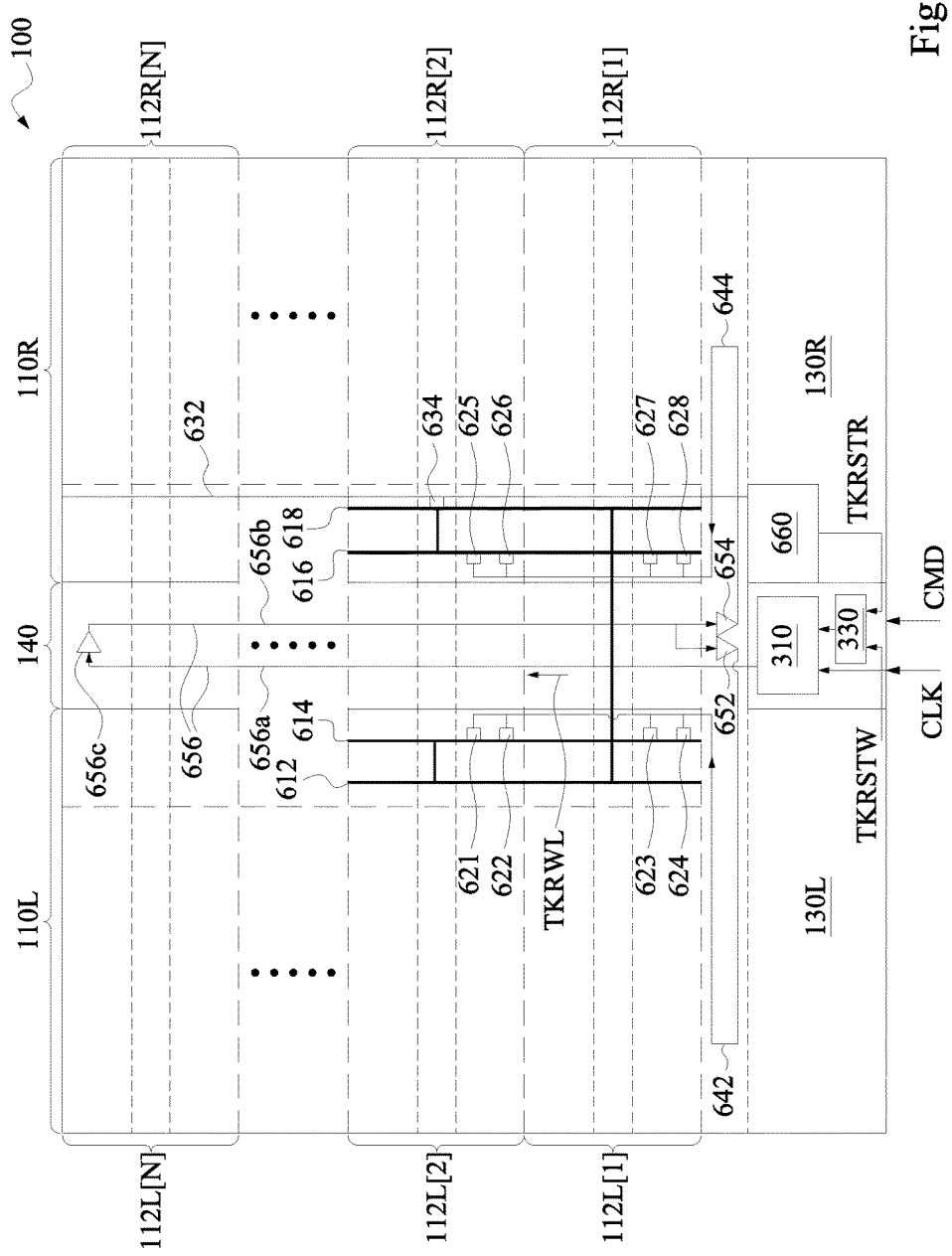
FIG. 6 is a block diagram of a memory macro having a read tracking circuit associated with a control circuit of the memory macro in accordance with some embodiments.

FIG. 6 is a block diagram of a memory macro 100 having a read tracking circuit associated with a control circuit 300, such as control circuit 300 usable in memory macro 100, in accordance with some embodiments. The components in FIG. 6 that are the same or similar to those in FIG. 1 and FIG. 3 are given the same reference numbers. In some embodiments, the read tracking circuit illustrated in FIG. 6 is an example implementation of one of tracking circuit 320A or 320B.

As depicted in FIG. 6, memory macro 100 also includes a clock generator 310 and a reset generator 330 as described in FIG. 3 and working in conjunction with a read tracking circuit illustrated herein. Read tracking circuit depicted in FIG. 6 includes a plurality of tracking bit lines 612, 614, 616, and 618, a plurality of read tracking cells 621, 622, 623, 634, 625, 626, 627, and 628 coupled with the plurality of tracking bit lines, a tracking global bit line 632, a global tracking bit line driver 634 electrically coupling tracking global bit line 632 with one of the plurality of tracking bit lines, two tracking word lines 642 and 644, two tracking word line drivers 652 and 654 for driving the tracking word lines 642 and 644, and a tracking delay path 656 between clock generator 310 and tracking word line drivers 652 and 654.

Read tracking circuit depicted in FIG. 6 also includes a GIO driver 660 within in GIO circuit 130R configured to generate a read tracking reset signal TKRSTR based on a signal at tracking global bit line 632. Reset generator 330 receives read tracking reset signal TKRSTR and a write tracking reset signal TKRSTW usable as the tracking reset signals TKRSTA and TKRSTB in FIG. 3.

In operation, clock generator 310 generates a tracking word line signal TKRWL and transmit tracking word line signal TKRWL to tracking delay path 656. Tracking delay path 656 is in decoder array 140 and includes two conductive segments 656a and 656b and a buffer 656c. Conductive segments 656a and 656b extend through about the entire height of memory arrays 110L and 110R and are usable to emulate the delay attributable to transmitting a word line signal to a corresponding word line driver in decoder array 140. Buffer 656c is usable to relay tracking word line signal TKRWL from conductive segment 656a to conductive segment 656b. Tracking word line drivers 652 and 654 then receives tracking word line signal TKRWL from tracking delay path 656 and pass tracking word line signal TKRWL to tracking word lines 642 and 644. Tracking word line signal TKRWL is then used to activate read tracking cells 621-628, and tracking cells 621-628 subsequently cause a signal transition at tracking bit lines 612, 614, 616, and 618. Global tracking bit line driver 634 relays the signal from tracking bit lines 612, 614, 616, and 618 to tracking global bit line 632. Finally, GIO driver 660 generates read tracking reset signal TKRSTR based on a signal at tracking global bit line 632.

The configuration of read tracking circuit in FIG. 6 is illustrated as an example. In some embodiments, the number of read tracking cells 621-628, the number of tracking bit lines 612-618, the length of the tracking bit lines, the length of tracking delay path 656, the number of tracking word lines 642 and 644, and/or the length of the tracking word lines vary.

Figure 7:
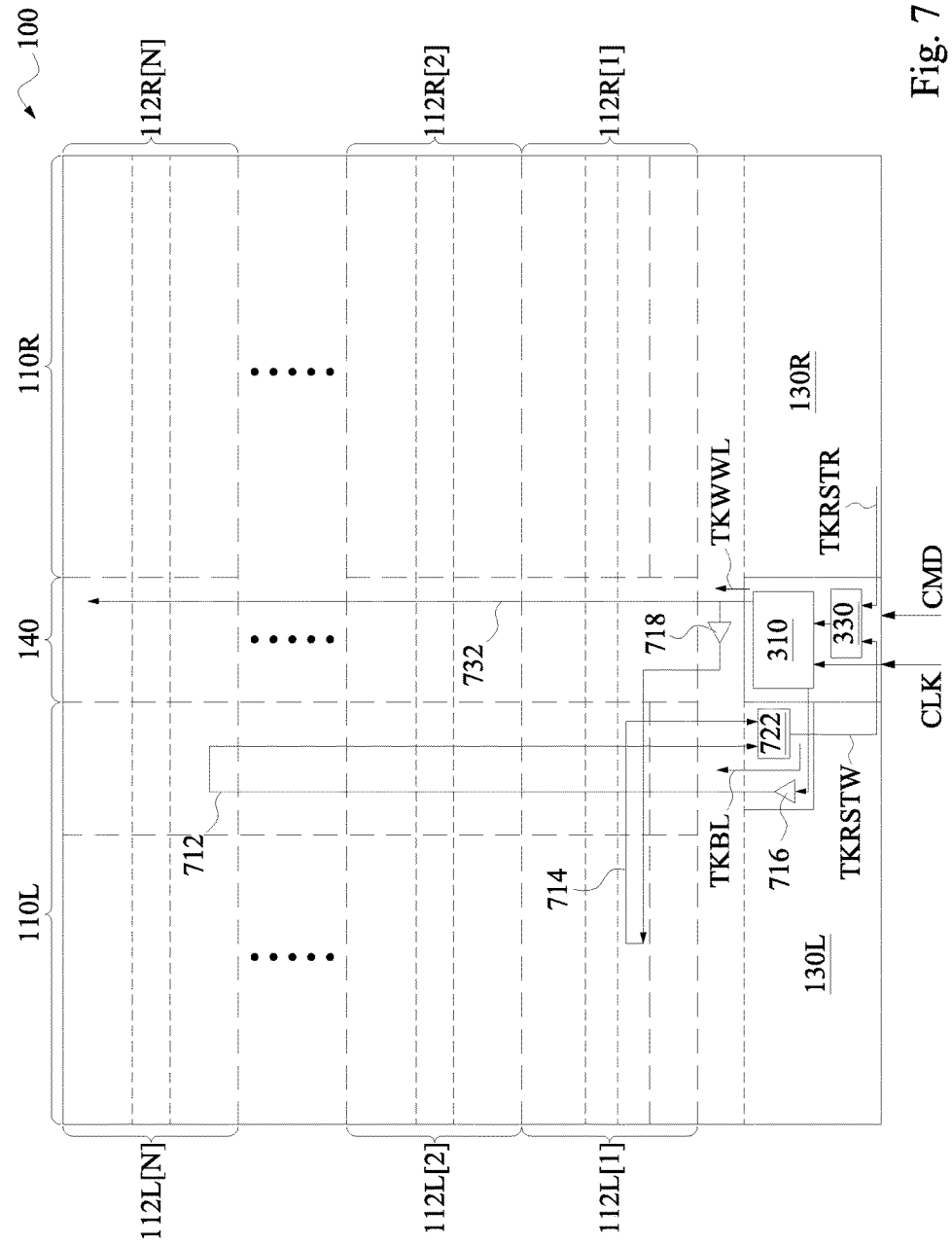
FIG. 7 is a block diagram of a memory macro having a write tracking circuit associated with a control circuit of the memory macro in accordance with some embodiments.

FIG. 7 is a block diagram of a memory macro 100 having a write tracking circuit associated with a control circuit, such as control circuit 300 usable in memory macro 100, in accordance with some embodiments. The components in FIG. 7 that are the same or similar to those in FIG. 1 and FIG. 3 are given the same reference numbers. In some embodiments, the write tracking circuit illustrated in FIG. 7 is an example implementation of one of tracking circuit 320A or 320B.

As depicted in FIG. 7, memory macro 100 includes a clock generator 310 and a reset generator 330 as described in FIG. 3 and working in conjunction with a write tracking circuit illustrated herein. Write tracking circuit depicted in FIG. 7 includes a tracking bit line 712, a tracking word line 714, a tracking bit line driver 716 for driving the tracking bit line 712, a tracking word line driver 718 for driving the tracking word line 714, a write tracking cell 722 coupled with the tracking bit line and tracking word line, and a tracking load path 732. Write tracking cell 722 is configured to generate a write tracking reset signal TKRSTW based on a signal at tracking bit line 712 and a signal at tracking word line 714. Reset generator 330 receives a read tracking reset signal TKRSTR and write tracking reset signal TKRSTW usable as the tracking reset signals TKRSTA and TKRSTB in FIG. 3.

In operation, clock generator 310 generates a tracking word line signal TKWWL and transmits tracking word line signal TKWWL to tracking load path 732 and tracking word line driver 718. Tracking load path 732 is in decoder array 140 and is usable to emulate a load for transmitting a word line signal to a corresponding word line driver in decoder array 140. Tracking word line driver 718 relays tracking word line signal TKWWL to tracking word line 714. Clock generator 310 also generates a tracking bit line signal TKBL and transmits tracking bit line signal TKBL to tracking bit line driver 716. Tracking bit line driver 716 relays tracking bit line signal TKBL to tracking word line 712. Write tracking cell 722 then generate write tracking reset signal TKRSTW based on a signal at tracking bit line 712 and a signal at tracking word line 714.

The configuration of write tracking circuit in FIG. 7 is illustrated as an example. In some embodiments, the configuration and size of tracking cell 722, the number of tracking bit line 712, the length of the tracking bit line, the length of tracking load path 732, the number of tracking word line 714, and/or the length of the tracking word line vary.

In accordance with one embodiment, a method includes using a first tracking circuit corresponding to a first set of access ports of a memory macro to cause a signal transition of a first tracking signal based on an edge of a clock signal.

Using a second tracking circuit corresponding to a second set of access ports of the memory macro, a signal transition of a second tracking signal is caused based on the edge of the clock signal. A reset signal is generated based on the signal transition of the first tracking signal and the signal transition of the second tracking signal. A read operation or a write operation on the memory macro is performed based on the edge of the clock signal and the reset signal.

In accordance with another embodiment, a method includes generating a first edge of a first word line signal in response to an edge of a clock signal. The first word line signal corresponds to accessing a first memory cell of a memory macro through a first access port of the first memory cell. A first tracking circuit is caused to generate a signal transition of a first tracking signal based on the edge of the clock signal, and the first tracking circuit corresponds to the first access port of the first memory cell. A second tracking circuit is caused to generate a signal transition of a second tracking signal based on the edge of the clock signal, and the second tracking circuit corresponds to a second access port of the first memory cell. A second edge of the first word line signal is generated based on time of occurrence of the signal transition of the first tracking signal and the signal transition of the second tracking signal.

In accordance with another embodiment, a control circuit includes a clock generator, a first tracking circuit, a first tracking circuit, and a reset generator. The clock generator is configured to generate a first control signal based on a clock signal and a reset signal, and the first control signal corresponds to accessing a first memory cell of a memory macro through a first access port of the first memory cell. The first tracking circuit is electrically coupled with the clock generator and configured to generated a first tracking signal based on an edge of the clock signal, and the first tracking circuit corresponds to the first access port of the memory cell. The second tracking circuit is electrically coupled with the clock generator and configured to generate a second tracking signal based on the edge of the clock signal, and the second tracking circuit corresponds to a second access port of the memory cell. The reset generator is electrically coupled with the first tracking circuit and the second tracking circuit and configured to generate the reset signal based on the first tracking signal and the second tracking signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   using a first tracking circuit corresponding to a first set of access ports of a memory macro to cause a signal transition of a first tracking signal based on an edge of a clock signal;
   using a second tracking circuit corresponding to a second set of access ports of the memory macro to cause a signal transition of a second tracking signal based on the edge of the clock signal;
   generating a reset signal based on the signal transition of the first tracking signal and the signal transition of the second tracking signal, wherein the generating the reset signal is performed based on a later one of the signal transition of the first tracking signal or the signal transition of the second tracking signal; and
   performing a read operation or a write operation on the memory macro based on the edge of the clock signal and the reset signal.

2. The method of claim 1, wherein performing a read operation or a write operation on the memory macro comprises:
   performing the read operation through one of the first set of access ports, the first set of access ports being read ports; and
   performing the write operation through one of the second set of access ports, the second set of access ports being write ports.

3. The method of claim 1, further comprising:
   using one or more other tracking circuits corresponding to one or more other sets of access ports of the memory macro to cause one or more signal transitions of one or more other tracking signals based on the edge of the clock signal,
   wherein
      the generating a reset signal is performed based on a latest one of the signal transition of the first tracking signal, the signal transition of the second tracking signal, or the one or more signal transitions of the one or more other tracking signals.

4. The method of claim 1, wherein the performing a read operation or a write operation of a memory macro comprises:
   generating first signal transitions of a plurality of word line signals based on the edge of the clock signal; and
   concurrently generating second signal transitions of the plurality of word line signals based on the reset signal.

5. The method of claim 4, wherein the performing a read operation or a write operation of a memory macro further comprises:
   accessing a first memory cell of the memory macro through the first access port of the first memory cell in response to a first word line signal of the plurality of word line signals; and
   accessing a second memory cell of the memory macro through the second port of the second memory cell in response to a second word line signal of the plurality of word line signals,
   wherein
      the first memory cell is configured to receive the first word line signal at the first access port of the first memory cell and to receive the second word line signal at the second access port of the first memory cell; and
      the second memory cell is configured to receive the first word line signal at the first access port of the second memory cell and to receive the second word line signal at the second access port of the second memory cell.

6. The method of claim 5, wherein
   the accessing a first memory cell of the memory macro through the first access port of the first memory cell is reading the first memory cell through a read port of the first memory cell; and
   the accessing a second memory cell of the memory macro through the second access port of the second memory cell is writing the second memory cell through a write port of the second memory cell.

7. A method, comprising:

generating a first edge of a first word line signal in response to an edge of a clock signal, the first word line signal corresponding to accessing a first memory cell of a memory macro through a first access port of the first memory cell;

causing a first tracking circuit to generate a signal transition of a first tracking signal based on the edge of the clock signal, the first tracking circuit corresponding to the first access port of the first memory cell;

causing a second tracking circuit to generate a signal transition of a second tracking signal based on the edge of the clock signal, the second tracking circuit corresponding to a second access port of the first memory cell; and generating a second edge of the first word line signal based on a time of occurrence of the signal transition of the first tracking signal and the signal transition of the second tracking signal, wherein the generating the second edge of the first word line signal is performed based on a later one of the signal transition of the first tracking signal or the signal transition of the second tracking signal.

8. The method of claim 7, further comprising:

causing a third tracking circuit to generate a signal transition of a third tracking signal based on the edge of the clock signal, the third tracking circuit corresponding to a third access port of the first memory cell, wherein the generating a second edge of the first word line signal is performed based on a latest one of the signal transition of the first tracking signal, the signal transition of the second tracking signal, and the signal transition of the third tracking signal.

9. The method of claim 7, wherein the memory macro further comprises a second memory cell, the second memory cell comprising a first access port and a second access port;

the first tracking circuit corresponds to the first access port of the first memory cell and the first access port of the second memory cell;

the second tracking circuit corresponds to the second access port of the first memory cell and the second access port of the second memory cell; and the method further comprises:

generating a first edge of a second word line signal in response to the edge of the clock signal, the second word line signal corresponding to accessing the second memory cell of the memory macro through the second access port of the second memory cell; and generating a second edge of the second word line signal based on the time of occurrence of the signal transition of the first tracking signal and the signal transition of the second tracking signal.

10. The method of claim 9, wherein the first access port of the first memory cell and the first access port of the second memory cell are configured to receive the first word line signal;

the second access port of the first memory cell and the second access port of the second memory cell are configured to receive the second word line signal;

the accessing the first memory cell using the first word line comprises reading the first memory cell; and the accessing the second memory cell using the second word line comprises writing the second memory cell.

11. The method of claim 7, wherein the first access port of the first memory cell is a read port of the first memory cell; and the accessing the first memory cell through the first access port of the first memory cell comprises reading the first memory cell through the first access port.

12. The method of claim 7, wherein the first access port of the first memory cell is a write port of the first memory cell; and the accessing the first memory cell through the first access port of the first memory cell comprises writing the first memory cell through the first access port.

13. A control circuit, comprising:

a clock generator configured to generate a first control signal based on a clock signal and a reset signal, the first control signal corresponding to accessing a first memory cell of a memory macro through a first access port of the first memory cell;

a first tracking circuit electrically coupled with the clock generator and configured to generate a first tracking signal based on an edge of the clock signal, the first tracking circuit corresponding to the first access port of the first memory cell;

a second tracking circuit electrically coupled with the clock generator and configured to generate a second tracking signal based on the edge of the clock signal, the second tracking circuit corresponding to a second access port of the first memory cell; and a reset generator electrically coupled with the first tracking circuit and the second tracking circuit and configured to generate the reset signal based on the first tracking signal and the second tracking signal, wherein the first tracking circuit is configured to generate a transition of the first tracking signal based on the edge of the clock signal;

the second tracking circuit is configured to generate a transition of the second tracking signal based on the edge of the clock signal; and the reset generator is configured to generate the reset signal based on a later one of the transition of the first tracking signal or the transition of the second tracking signal.

14. The control circuit of claim 13, further comprising:

a third tracking circuit electrically coupled with the clock generator and configured to generate a third tracking signal based on the edge of the clock signal, the third tracking circuit corresponding to a third access port of the first memory cell, wherein the reset generator is configured to generate the reset signal based on the first tracking signal, the second tracking signal, and the third tracking signal.

15. The control circuit of claim 14, wherein the first tracking circuit is configured to generate a transition of the first tracking signal based on the edge of the clock signal;

the second tracking circuit is configured to generate a transition of the second tracking signal based on the edge of the clock signal;

the third tracking circuit is configured to generate a transition of the third tracking signal based on the edge of the clock signal; and the reset generator is configured to generate the reset signal based on a latest one of the transition of the first tracking signal, the transition of the second tracking signal, or the transition of third tracking signal.

16. The control circuit of claim 13, wherein
the clock generator is configured to further generate a second control signal based on the clock signal and the reset signal, the memory macro further comprising a second memory cell, the second memory cell comprising a first access port and a second access port, and the second control signal corresponding to accessing the second access port of the second memory cell of the memory macro.

17. The control circuit of claim 16, wherein the clock generator is configured to concurrently generate a signal transition of the first control signal and a signal transition of the second control signal based on the reset signal.

* * * * *